United States Patent
Chun et al.

(10) Patent No.: US 7,911,843 B2
(45) Date of Patent: Mar. 22, 2011

(54) NON-VOLATILE MEMORY DEVICE AND PROGRAM METHOD THEREOF

(75) Inventors: Jin-Young Chun, Seoul (KR); Jae-Yong Jeon, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 105 days.

(21) Appl. No.: 12/476,876

(22) Filed: Jun. 2, 2009

(65) Prior Publication Data

US 2009/0323431 A1 Dec. 31, 2009

(30) Foreign Application Priority Data

Jun. 25, 2008 (KR) ........................ 10-2008-0060398

(51) Int. Cl.
*G11C 11/04* (2006.01)
(52) U.S. Cl. .......... 365/185.14; 365/185.28; 365/185.22
(58) Field of Classification Search ............. 365/185.14, 365/185.22, 185.28
See application file for complete search history.

(56) References Cited

U.S. PATENT DOCUMENTS 7,023,730 B2 * 4/2006 Kouno .................. 365/185.12

FOREIGN PATENT DOCUMENTS

| JP | 2004-253089 | 9/2004 |
|---|---|---|
| KR | 1020010061476 | 7/2001 |
| KR | 1020010065151 | 7/2001 |

* cited by examiner

*Primary Examiner* — Huan Hoang
*Assistant Examiner* — Anthan T Tran
(74) *Attorney, Agent, or Firm* — F. Chau & Associates, LLC

(57) ABSTRACT

A method of programming a non-volatile memory device employing program loops. Each program loop comprises a programming operation and a subsequent plurality of verifying operations. The method includes preventing the next program loop based on the results of performing the plurality of verifying operations of a current program loop each verifying operation verifying whether the selected memory cell transistors are program-passed. The decision to re-program may be based on a program pass number of the memory cell transistors obtained as a result of the plurality of verifying operations of the current program loop.

19 Claims, 10 Drawing Sheets

US 7,911,843 B2

NON-VOLATILE MEMORY DEVICE AND PROGRAM METHOD THEREOF

PRIORITY STATEMENT

This application claims priority, under 35 U.S.C §119, to Korean Patent Application No. 2008-60398, filed on Jun. 25, 2008, in the Korean Intellectual Property Office, the entire contents of which are incorporated by reference herein.

BACKGROUND

1. Technical Field

The present invention relates to a semiconductor memory device, more particularly, the present invention relates to a non-volatile memory device and programming method thereof.

2. Description of Related Art

The semiconductor memory device types include volatile memory devices and a non-volatile memory devices.

The read and write operations of a volatile memory device may be performed relatively rapidly however data retained therein expires when power supply is off. Examples of volatile memory devices include a Static Random Access Memory (SRAM), a Dynamic Random Access Memory (DRAM), and a Synchronous Dynamic Random Access Memory (SDRAM).

The non-volatile memory device retains stored data even while the power supply is cut off. Therefore, the non-volatile memory device is used to save contents that must be retained, regardless of whether power is supplied or not. Examples of non-volatile memory devices include a Read-only Memory (ROM), a Programmable Read-only Memory (PROM), an Erasable Programmable Read-only Memory (EPROM), an Electrically Erasable Programmable Read-only Memory (EEPROM), a flash memory, Phase-change Random Access Memory (PRAM), a Magnetic Random Access Memory (MRAM), a Resistive Random Access Memory (RRAM), Ferroelectric Random Access Memory (FRAM), and the like.

Flash memory, a type of non-volatile memory, has a function of erasing data of cells collectively. and is widely used in computer systems and memory cards.

Flash memory may be a NOR-type or a NAND-type, depending on connections between memory cell transistors and to a bit line. The NOR-type flash memory takes a form of two or more memory cell transistors connected in parallel to one bit line, stores data by using a Channel Hot Electron method, and erases data by using a Fowler-Nordheim tunneling. On the other hand, the NAND-type flash memory takes a form of two or more cell transistors connected in series to one bit line, and stores and erases data by using the Fowler-Nordheim tunneling. The NOR-type flash memory is not suitable for high integration due to consumption of large amount of current, however it is advantageous in that it can adapt easily to acceleration of its operation speed. On the other hand, the NAND-type flash memory may be more highly integrated as it uses less cell current compared to the NOR-type flash memory.

After a programming operation has been performed in an above-described non-volatile memory device, it must be determined whether a memory cell transistor is correctly programmed to have a required threshold voltage Vth correctly indicating the stored data value. Such operation is called a verifying operation (or, a verify-read operation). In general, a programming operation and a verifying operation form one loop (cycle), and such loops are repeated a predetermined number of times. For example, after a memory cell transistor is programmed, whether a threshold voltage Vth of a programmed memory cell transistor is higher than the verify-read voltage $V_{vfy}$, is determined when a verify-read voltage $V_{vfy}$ is applied to a selected word line. If a threshold voltage Vth of a programmed memory cell transistor is determined to be higher than a verify-read voltage $V_{vfy}$, a re-programming operation of a memory cell transistor is not performed, and the next loop is cancelled. Then such a memory cell transistor may be deemed a correctly programmed cell. On the other hand, if a threshold voltage Vth of a programmed memory cell transistor is determined to be lower than a verify-read voltage $V_{vfy}$, a re-programming operation of a memory cell transistor is performed in the next loop. The number of programmed cells may gradually increase with repetitions of the programming, loops. In other words, the number of memory cell transistors to-be-programmed (or, number of bits to-be-programmed) may gradually decrease with repetitions of the programming, loops.

SUMMARY

A first aspect of the invention provides a method of programming a non-volatile memory device. The method comprises programming selected memory cell transistors; then performing a plurality of verifying operations on the selected memory cell transistors, each verifying whether the selected memory cell transistors are program-passed; and then controlling (deciding) whether to end the program loops based on a program pass number pp of the memory cell transistors obtained as a result of the plurality of verifying operations, wherein the programming and the performing the plurality of verifying operations configure one program loop.

Another aspect of the invention provides, a non-volatile memory device comprising a memory cell transistor array having memory cell transistors arranged in rows and columns; a write circuit configured to program selected memory cell transistors; a verifier configured to perform a plurality of verifying operations on the selected memory cell transistors each verifying whether the selected memory cell transistors are program-passed; and a control part configured to control whether to end the programming of the selected memory cell transistors based on a program-pass number pp of the selected memory cell transistors obtained from a result of the plurality of verifying operations, wherein the programming operation and the plurality of the verifying operations configure one program loop.

The exemplary embodiments will now be described more fully hereinafter with reference to the accompanying drawings, in which embodiments are shown. The invention, however, may be embodied in many different forms and should not be construed as limited to the exemplary embodiments set forth herein. Rather, these exemplary embodiments are provided so that this disclosure will be thorough and complete. In the drawings, the thicknesses of or dimensions of features or elements may be exaggerated for clarity. Like numbers refer to like elements throughout.

It will be understood that when an element or layer is referred to as being "on", "connected to" or "coupled to" or "controlled by" another element or layer, it can be directly on, connected or coupled to or controlled by the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF THE EMBODIMENTS

Figure 1:
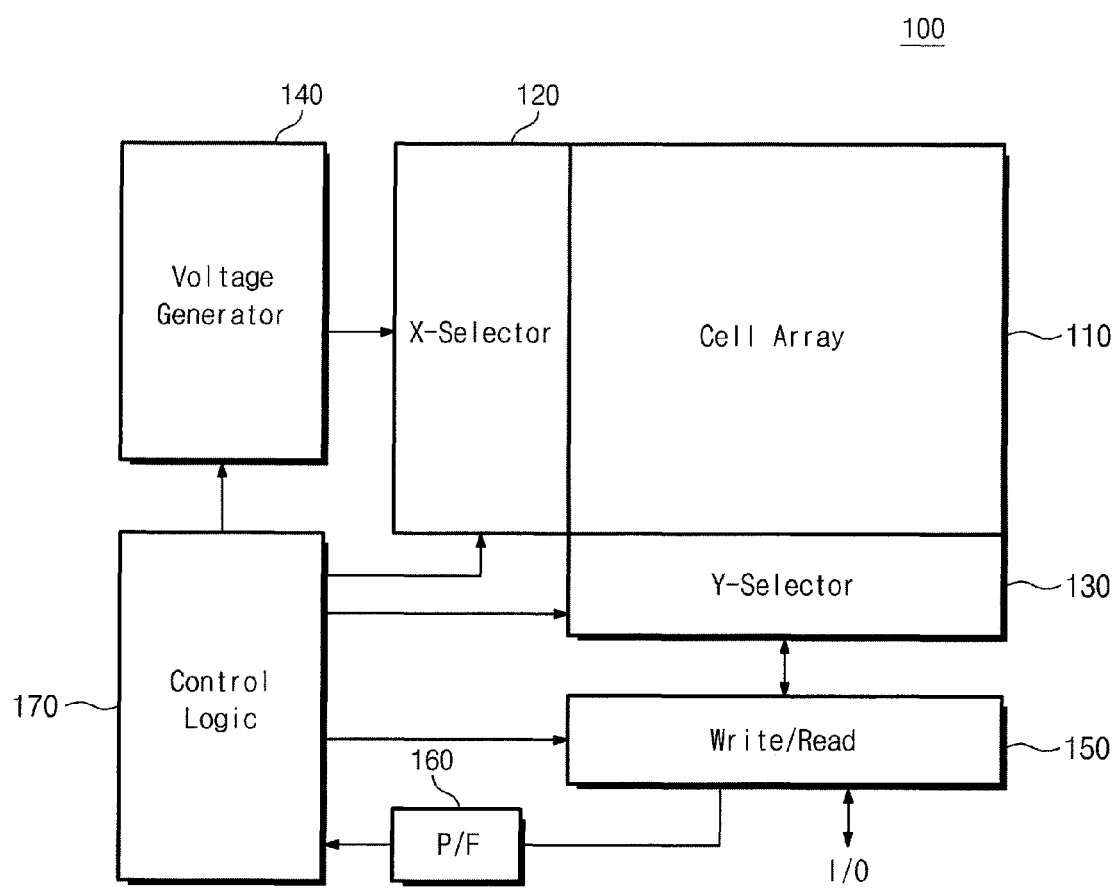
FIG. 1 is a schematic block diagram of a non-volatile memory device according to an exemplary embodiment of the invention.
Figure 2:
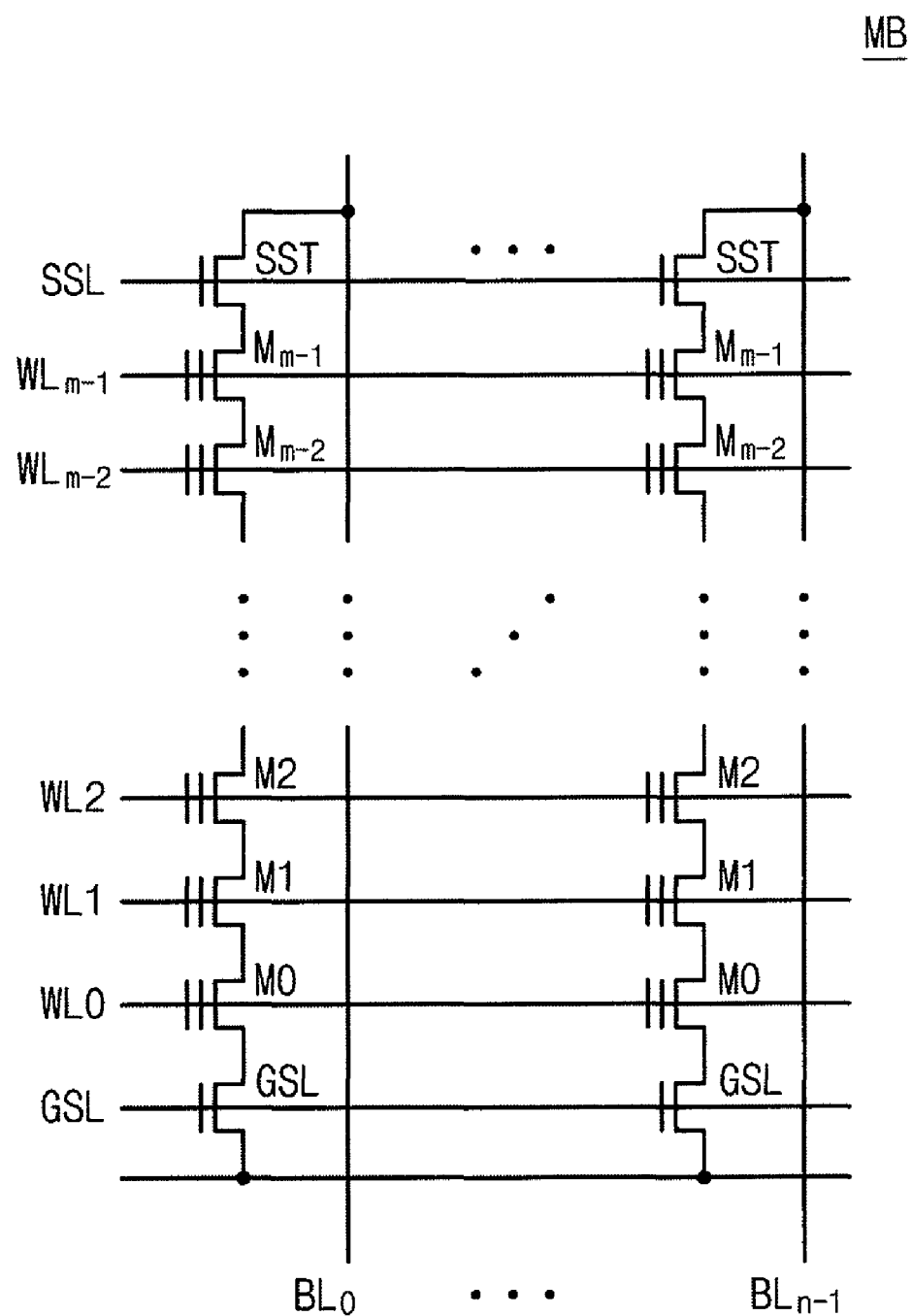
FIG. 2 and FIG. 3 are circuit diagrams of exemplary NAND and NOR configurations of memory cell transistors in the memory cell transistor array in FIG. 1.
Figure 3:
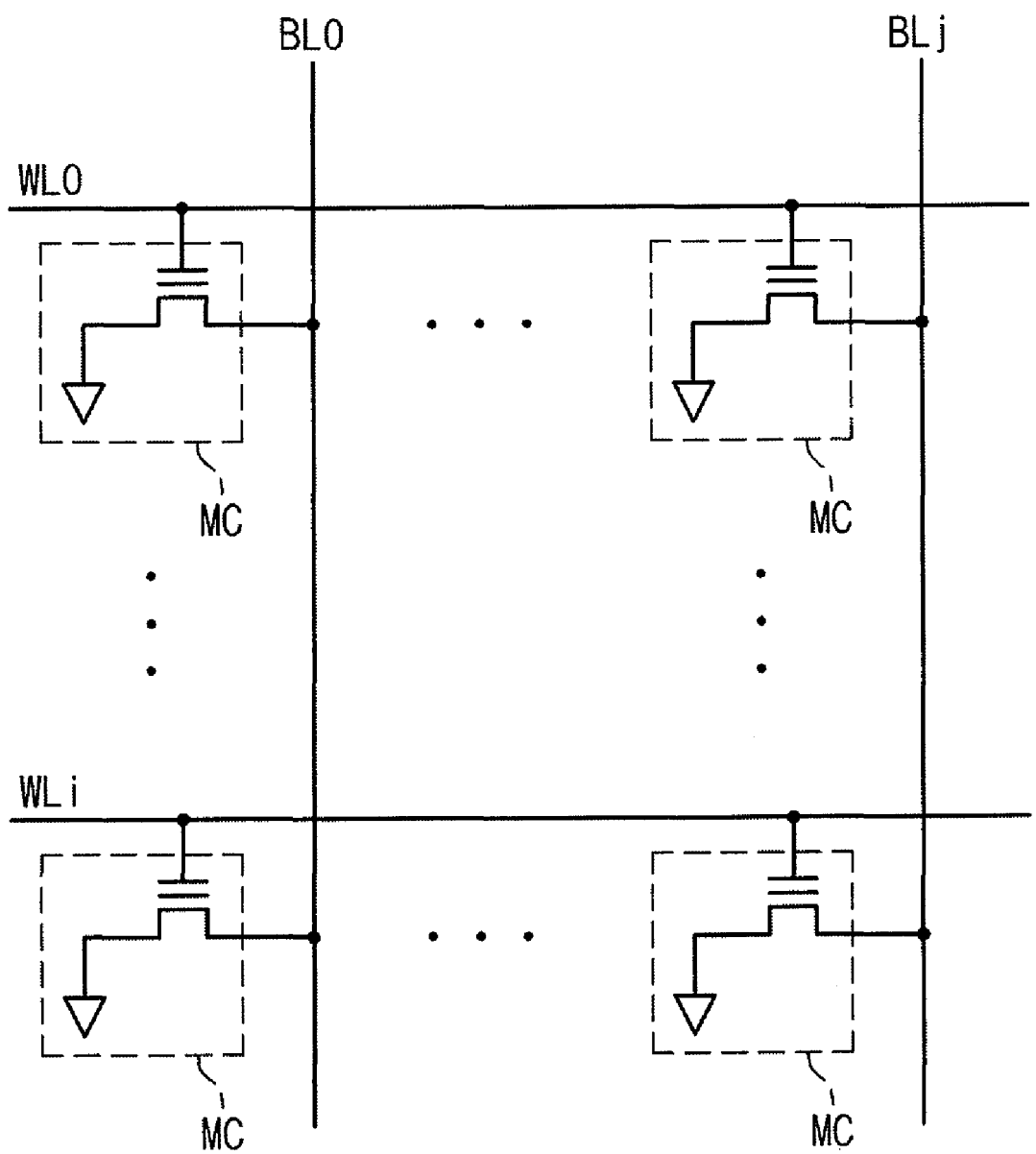

FIG. 1 is a schematic block diagram of a non-volatile memory device according to an exemplary embodiment of the invention. FIG. 2 and FIG. 3 are circuit diagrams illustrating exemplary NAND and NOR configurations of memory cell transistors in the memory cell transistor array in FIG. 1. The flash memory device 100 is a non-volatile memory device capable of retaining stored data even while power is cut off. Due to this characteristic, the flash memory device 100 may be used as an code (e.g., executable(boot) code) storage and stores contents required to be retained regardless of power supply, as well as being used as a data storage. A flash memory device 100 may be employed in a cellular phone, PDA digital camera, portable game console, mobile devices such as an MP3P, HDTV, DVD, and router, and home applications such as GPS. However, the flash memory device may also be employed in other memory devices (for example, MROM (Mask ROM), PROM, FRAM).

Referring to FIG. 1, the non-volatile memory device 100 includes a memory cell transistor array 110, a X(row) selector 120, a Y(column) selector 130, a voltage generator 140, a write/read (page-buffer, sense amp) circuit 150, a pass/fail verifier 160, and a control logic 170.

The memory cell transistor array 110 includes memory cell transistors arranged in a plurality of rows (along word lines) and a plurality of columns (along bit lines), and the respective memory cell transistors may store N-bit data information (N is a positive number equal to or larger than 1).

The plurality of memory cell transistors included in the memory cell transistor array 110 are organized in a plurality of memory blocks MBs. The memory cell transistors included in the respective memory blocks in the non-volatile memory device 100 may be interconnected in a NAND string structure as shown in FIG. 2, or may be interconnected in a NOR structure as shown in FIG. 3. As will be described in detail below, operation characteristics of the non-volatile memory device 100 may be applied to either of the NAND-type memory cell transistors and NOR-type memory cell transistors illustrated in FIG. 2 and FIG. 3. In addition, the operation characteristics of the non-volatile memory device 100 may be applied to a flash memory device having memory cell transistors in which a charge storage layer is formed of a conductive floating gate, and or a charge trap flash (CTF) having memory cell transistors in which the charge storage layer is formed of an charge-trapping non-conductive layer.

A flash memory device having a NOR structure is described below as an example. However, the flash memory device 100 to be described is not limited to a certain form, and also a programming operation or a verifying operation of the flash memory device is not limited to the NOR-type arrangement of memory cell transistors illustrated in FIG. 3.

A NOR-type memory cell transistor is programmed by supplying a program voltage Vpgm (e.g., approximately 10V to 20V) to its control gate and by supplying a voltage (e.g., 5V to 6V) to its drain area, with its source area and bulk (or, substrate) being grounded(e.g. 0V). In the bias condition, a large amount of cell current flows from the drain area to the (grounded) source area. Such programming method is called a hot-electron injection.

A large reverse voltage must be applied between the control gate and the substrate (or, bulk) to erase NOR-type memory cell transistors. For this, a negative high voltage (e.g., −10V) is supplied to the control gate, and an appropriate voltage (e.g., 5V) is supplied to the bulk area (substrate). This causes electrons to flow out from a floating gate through Fowler-Nordheim tunneling. The drain area is maintained in a high impedance state (for example, in a floating state) to maximize the erasing effect.

In an example of a reading operation of NOR-type memory cell transistors, a voltage of approximately 1V is applied to the drain area, a voltage of approximately 4.5V to the control gate, and a voltage of 0V to the source area and the substrate. If a reading operation is performed under such voltage conditions, the programmed memory cell transistors having threshold voltages that have been incremented via the hot-electron injection, prevent current flow from their drain area to the source area.

The X(row) selector 120 may operate in response to a control signal from the control logic 170, and may select one of the word lines in response to a row address, and may drive the selected word line with an appropriate word line voltage (e.g., program voltage Vpgm, verify-read voltage Vvfy, normal read voltage Vread).

The Y(column) selector 130 may operate in response to a control signal from the control logic 170, and may select a plurality of bit lines of the memory cell transistor array 110 in a predetermined unit (e.g., word unit or byte unit) in response to a column address. For example, in the case that programming is performed in byte units, eight bit lines may be selected by the Y(column) selector 130. I In the case that programming is performed in word units, sixteen bit lines may be selected by the Y(column) selector 130.

The voltage generator 140 generates a plurality of word line voltages (e.g., program voltage Vpgm, verify-read voltage Vvfy, normal read voltage Vread) required in the programming, erasing, and verify/normal reading operations of memory cell transistors. Further, the voltage generator 140 generates a bulk voltage Vbulk to be supplied to the bulk (substrate) in which memory cell transistors are formed. The voltage generator 140 may be configured to generate a progression of program voltages (Vpgm) by using incremental step pulse programming (ISPP), in a programming operation.

The write/read circuit 150 is controlled by the control logic 170, and includes a sense amplifier S/A and a write driver. The sense amplifier senses data bits on the selected bit lines from memory cell transistors of a selected word line. The data bits read by the sense amplifier are outputted to an external device depending on a mode of operation, or transferred to the pass/fail verifier 160. For example, in a normal read mode of operation, the data bits read by the sense amplifier are outputted to an external device (e.g., a memory controller or a host). On the other hand, data bits read by the sense amplifier in a verifying mode of operation are outputted to the pass/fail verifier 160. In a programming mode of operation, the write driver drives the selected bit lines with bit line voltages according to random data to-be-programmed. For example, in case random data to-be-programmed is program data, the write driver drives a bit line selected by the Y(column) selector 130 with a bit line voltage. In case data to-be-programmed is program-inhibited data, the write driver drives a bit line selected by the Y(column selector) 130 with a voltage (e.g., ground voltage) lower than the bit line voltage.

The first exemplary embodiment is a flash memory device 100 having a NOR structure, however, the flash memory device 100 having a NAND string structure can be implemented if the write/read circuit 150 comprises a page buffer circuit. The page buffer circuit may store (write) random data in memory cell transistors or read data from the memory cell transistors, under the control of the control logic 170. The page buffer circuit is connected to a memory cell transistor array 110 via a plurality of bit lines. A plurality of page buffer latches corresponding to the respective bit lines are provided in the page buffer circuit. Data to-be-programmed in a memory cell transistor, or data read from a memory cell transistor is temporarily stored in a corresponding page buffer. The page buffer circuit drives selected bit lines according to data values stored in the respective page buffers during a programming operation.

The pass/fail verifier 160 determines whether a programming operation has succeeded (passed) or failed to achieve a proper threshold voltage Vth, depending on threshold voltage Vth states of the memory cell transistors sensed via the sense amplifier during each verifying operation, and outputs the determined pass/fail result to the control logic 170.

The control logic 170 controls a write driver according to the sensed threshold voltage Vth states of memory cell transistors, and as a result, the appropriately programmed memory cell transistors having the appropriate threshold voltage Vth are no further programmed. For example, let us assume that a data value to be programmed in a memory cell transistor is '0'. If a sensed threshold voltage Vth state of a memory cell transistor indicates '1' meaning an erase state, a data value stored temporarily in a write driver remains at '0'. This means that the memory cell transistor will be re-programmed in a next program loop. In other words, a bit line voltage is provided to a bit line corresponding to the memory cell transistor in a next programming loop. If a sensed threshold voltage Vth state of a memory cell transistor is '0' indicating a programming state, then a data value stored temporarily in the write driver is switched from '0' to '1'. This means that re-programming of a memory cell transistor is prevented within the next program loop. In other words, the supply of re-programming bit line voltage to the bit line that corresponds to the memory cell transistor is cut off if the sensed threshold voltage Vth state of the memory cell transistor is '0' indicating a properly programmed state.

The control logic 170 controls the overall operations related to programming, erasing, and verify/normal read operations of the flash memory device 100. Data to-be-programmed is loaded in a write driver of the write/read circuit 150 according to a control signal from the control logic 170. In the time interval during which programming is performed, the control logic 170 is configured to supply a program voltage Vpgm to a selected word line, a bit line voltage Vb1 to selected bit lines, and a bulk voltage Vbulk to a bulk (substrate) in which memory cell transistors are formed. Selected bit lines may be driven with the bit line voltage according to random data loaded to the write driver of the write/read circuit 150, and the selected memory cell transistors on the selected word line may be programmed. The program voltages Vpgm, may be generated by using the incremental step pulse programming (ISPP) method. The level of the program voltage Vpgm increments in steps of a predetermined voltage increment amount ($\Delta V$) each time the programming loops are repeated. A supply number, a voltage level, and a voltage supply time period of the program voltage Vpgm used in the respective program loops may be varied according to the control of an external device (e.g., a memory controller) or of an internal device (e.g., control logic 170). Also, the control logic 170 supplies a bias voltage for verify or normal reading to selected word line and selected bit lines during an interval when a verify read or normal read operation is conducted. Accordingly, the sense amplifier of the write/read circuit 150 reads data bits on selected bit lines from the selected memory cell transistors. The data bits read by the sense amplifier in a normal read mode of operation are outputted to an external device. On the other hand, the data bits read by the sense amplifier in a verifying mode of operation are outputted to the pass/fail verifier 160.

Figure 4:
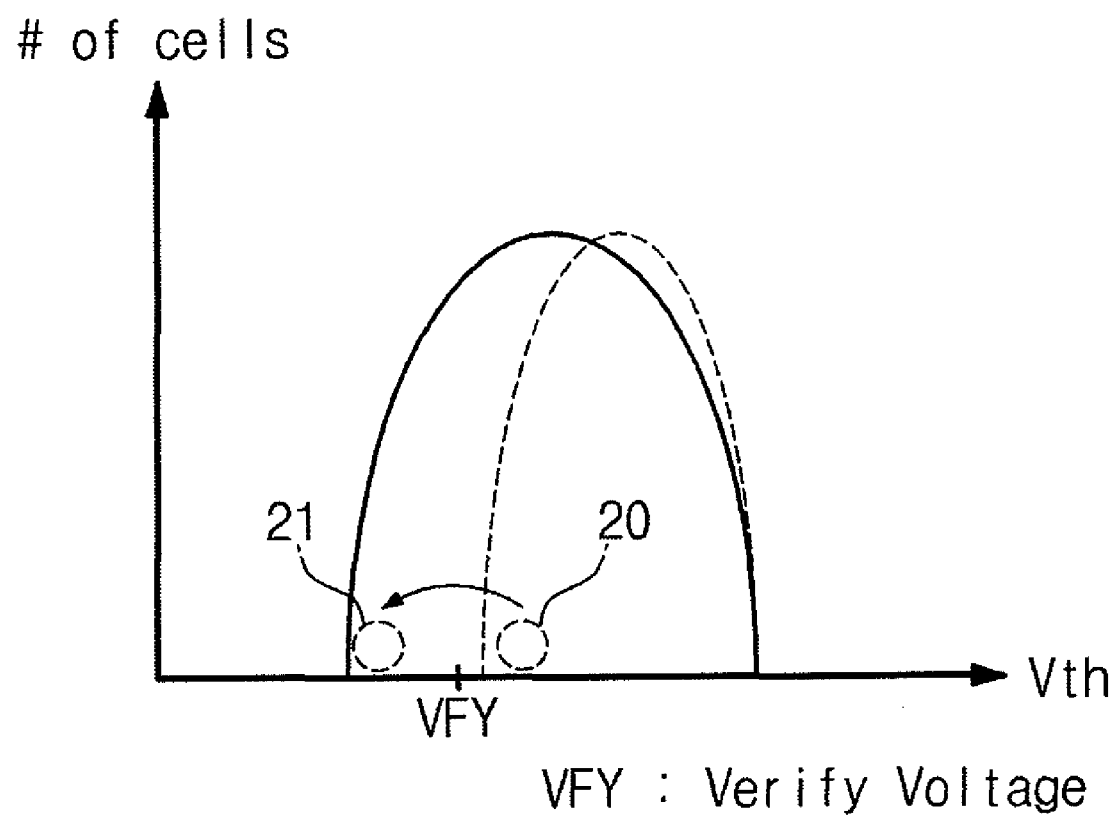
FIG. 4 is a graph depicting a distribution due to Random Telegraph Noise of threshold voltages of programmed memory cell transistor.
Figure 5:
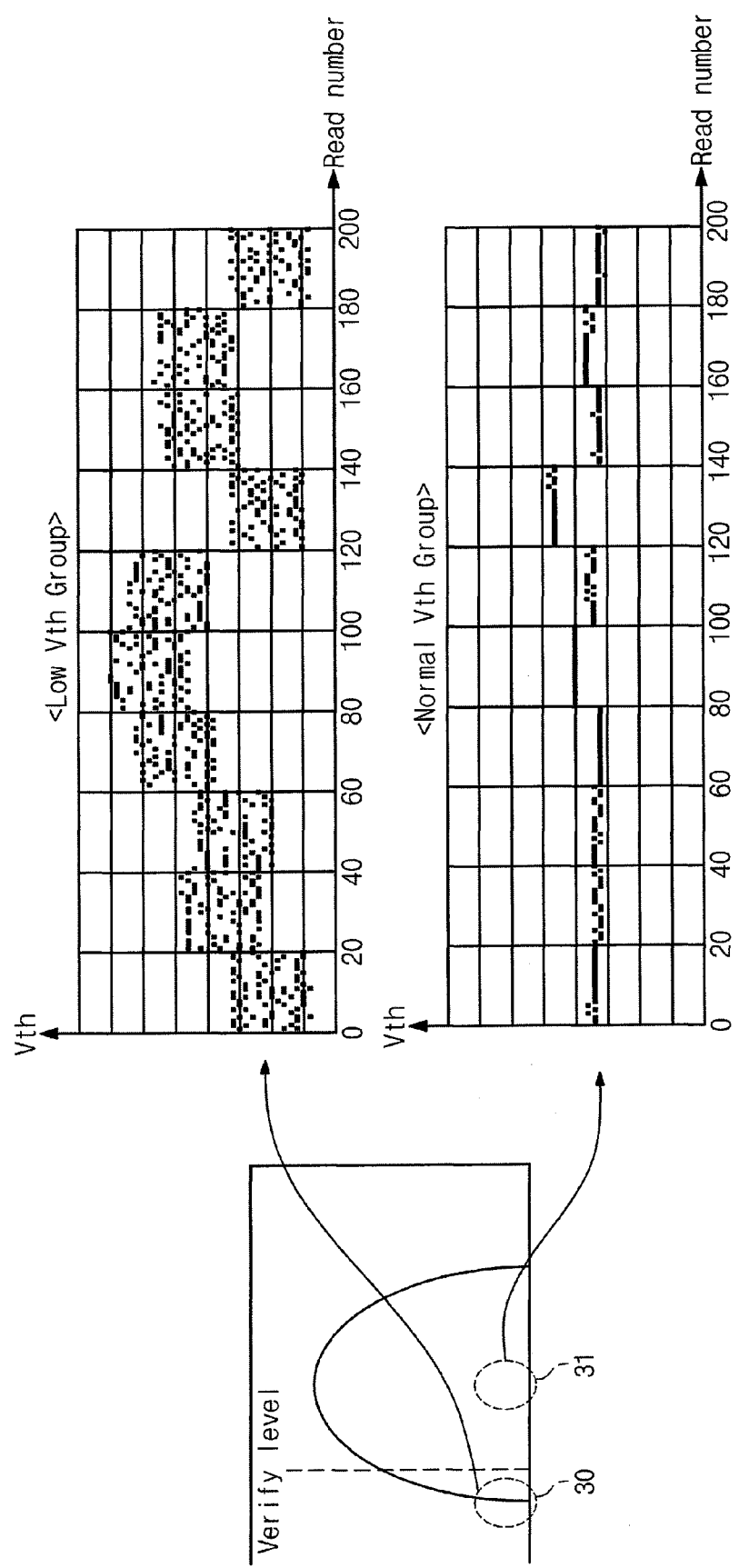
FIG. 5 is a table depicting a variation in the threshold voltages according to Random Telegraph Noise.

FIG. 4 is a graph depicting a distribution due to Random Telegraph Noise of threshold voltages of programmed memory cell transistors. FIG. 5 is a table depicting variations in the threshold voltages Vth according to Random Telegraph Noise.

The (drain) current flowing through a memory cell transistor may change as reading operations are performed repeatedly. A variation in drain current leads to variation in a threshold voltage. In general, this effect is called Random Telegraph Noise (RTN). The RTN has various causes. The RTN phenomenon may be caused by accumulation of charge in an insulation layer located between a floating gate (or, a charge accumulation gate) and the substrate. Referring to FIG. 4, if there is RTN, even if a threshold voltage Vth of a memory cell transistor is previously determined to be higher 20 than a verify-read voltage $V_{vfy}$, in a verifying operation, the threshold voltage Vth of the memory cell transistor may later be determined to be lower 21 than the verify-read voltage $V_{vfy}$. This is because the detected threshold voltage Vth of the memory cell transistor is varied by the RTN described above.

More specifically, as depicted in FIG. 5, threshold voltages Vth of memory cell transistors located in a lower portion 30 of a threshold voltage distribution are varied significantly as a result of repeated reading operations. On the other hand, threshold voltages of memory cell transistors located in a center portion 31 of the threshold voltage distribution are varied to a small degree due to repeated reading operations. As the threshold voltages of the memory cell transistors located in the lower portion 30 of the threshold voltage distribution are significantly varied, the reading margin may decrease. This means that an error in reading is generated and the threshold voltage distribution is widened.

Variations in the threshold voltage Vth of memory cell transistors due to RTN may cause serious defects in the operation of a multi-bit non-volatile memory device having small margins between multiple states.

The verify-read result may not be regular due to defect in a different type of cell current other than the RTN. An irregular verify-read result means that the threshold voltage distribution is widened.

Figure 6:
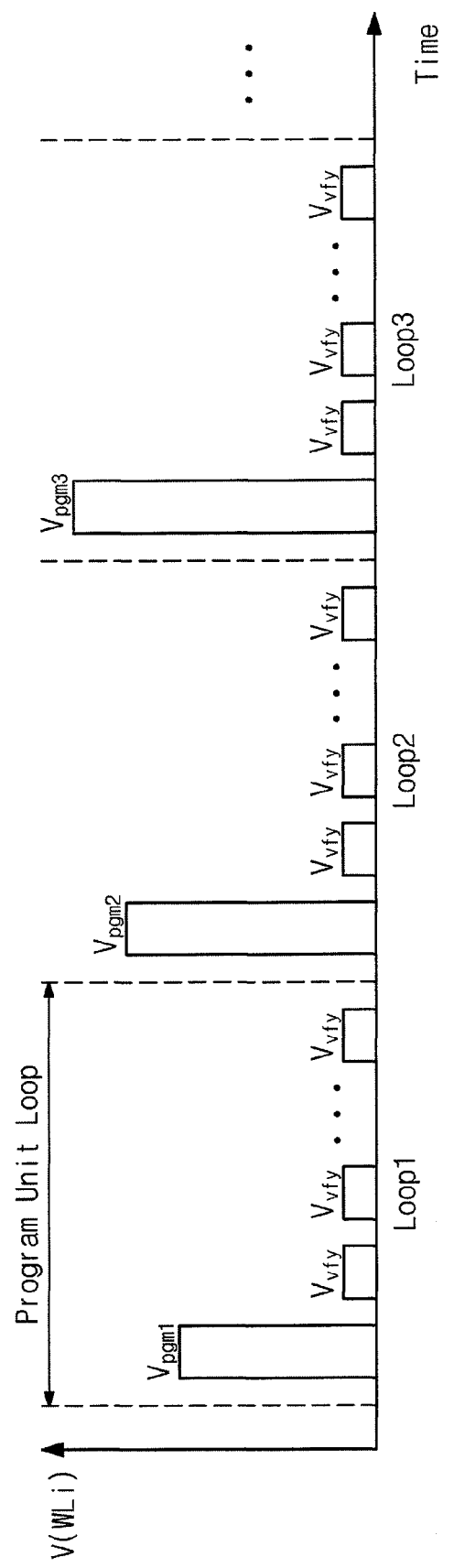
FIG. 6 is a timing diagram of voltages applied to a selected word line in non-volatile memory device of FIG. 1 illustrating program loops according to an exemplary embodiment of the invention.

FIG. 6 is a timing diagram of voltages applied to a selected word line in non-volatile memory device illustrating program loops (Loop(j): Loop 1, Loop 2, Loop3) according to an exemplary embodiment of the invention.

A verifying operation is repeated a given number of times (up to a predetermined maximum number vmax) in each of the respective program loops as depicted in FIG. 6, and the completion of programming is determined according to the number of program-"pass" memory cell transistors obtained from the verifying results.

Programming operations are performed via a plurality of program loops. Each of the program loops includes a programming time interval and a plurality of program verify time intervals. In each of the program loops, memory cell transistors are programmed according to the inputted data bits, and in each program verify interval it is verified whether the memory cell transistors are programmed correctly.

In FIG. 6, the voltage level of verify-read voltage $V_{vfy}$ and the time pulse duration of each verify-read voltage $V_{vfy}$ are fixed at the same predetermined value. But embodiments of the invention are not limited to the example illustrated in FIG. 6 and may be varied or modified in various ways.

The control logic 170 controls a X(row) selector 120, a Y(column) selector 130, a voltage generator 140, and a write/read circuit 150 so that the plurality vmax of verifying operations may be performed within each program loop in the verifying mode of operation. The pass/fail verifier 160 verifies repeatedly whether data read from the write/read circuit 150 is program-passed.

The control logic 170 determines whether, according to a pass/fail signal from the pass/fail verifier 160, a program pass number pp of memory cell transistors that program pass is greater than a reference number R. If the program pass number pp is greater than the reference number R, then the control logic 170 may end the programming. On the other hand, if the program pass number pp is less than the reference number R, a program loop including a re-programming operation and a plurality v up to predetermined maximum number vmax of verifying operations may be carried out (repeated) under the control of the control logic 170. The reference number R is preferably greater than 2 and may be a positive integer less than the total number of verifications performed in the pass/fail verifier 160. Alternatively, the reference number R may be an integer greater than half the total number of verifications performed in the pass/fail verifier 160 and less than the total number of verifications.

Comparing a program pass number pp with a reference number R may be performed after a plurality v up to a predetermined maximum number vmax of verifying operations are completed, or may be done each time a verifying operation is performed. The control logic 170 may end the programming loops after the plurality vmax of verifying operations are completed, by determining whether the program pass number pp is higher than the reference number R after the plurality vmax of verifying operations are completed. Alternatively, the control logic 170 may repeatedly decide whether to end the programming each time a verifying operation is performed, by determining whether the program pass number pp has reached the reference number R each time a verifying operation is performed on the memory cell transistors. In this case, the control logic 170 may end re-programming if the program pass number pp reaches the reference number R before all available verifying operations are completed. On the other hand, if the program pass number pp does not reach the reference number R until the plurality vmax of verifying operations are completed, the control logic 170 may repeat a program loop including a programming operation and a plurality vmax of verifying operations.

Figure 7:
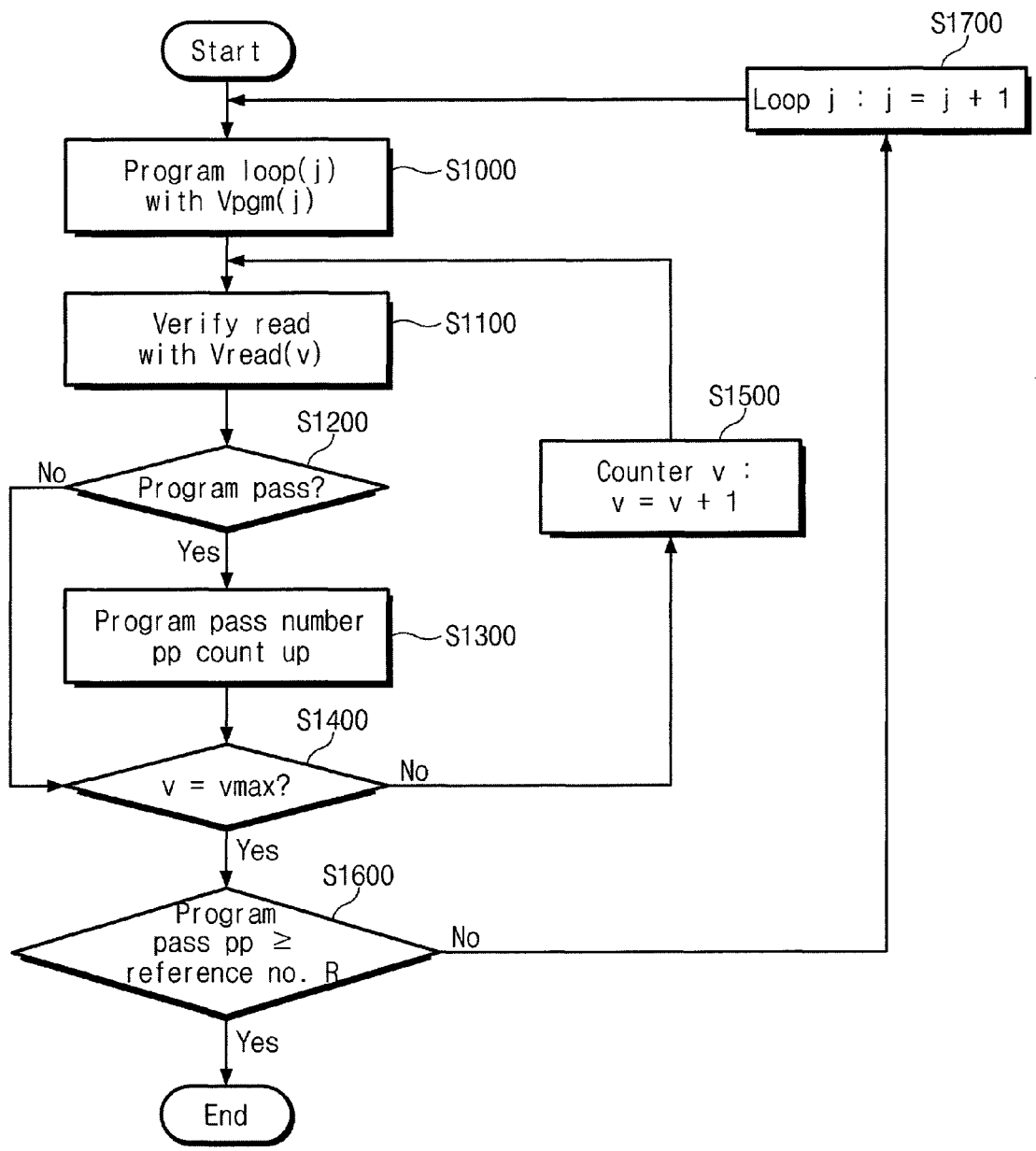
FIG. 7 is a flow chart depicting a method of programming a non-volatile memory device according to an exemplary embodiment of the invention.

FIG. 7 is a flow chart depicting a method of programming a non-volatile memory device 100 according to an exemplary embodiment of the invention. FIG. 7 depicts a case where re-programming is controlled to be ended after a plurality vmax of verifying operations are completed.

Initially, in programming step S1000, programming operations (including applying a programming voltage Vpgm(j)) are performed on memory cell transistors on a selected word line WL<i>. In verification step S1100, verifying operations are performed on the memory cell transistors on the selected word line WL<i>. If the memory cell transistors on the selected word line WL<i> are determined to be program-passed by the pass/fail verifier 160 in verification step S1200, then counting step S1300 is next performed. In counting step S1300, the control logic 170 counts the number pp of passing memory cell transistors and the process moves next to branch step S1400. On the other hand, if the memory cell transistors on the selected word line WL<i> are determined to be program-failed by the pass/fail verifier 160 in verification step S1200, the control logic 170 moves directly to perform decision/branch step S1400.

In decision/branch step S1400, the control logic 170 determines whether the predetermined maximum number vmax of verifying operations have all been completed. If the control logic 170 determines that the predetermined maximum number vmax of verifying operations have not been completed, the "NO" branch is selected and verification-count incrementing step S1500 is performed. In step S1500, the control logic 170 increments the verification counter in preparation to re-perform a verifying operation. The verification-count incrementing step S1500 could alternatively be performed between step 1100 and step S1400. However, if in decision/branch step S1400, the control logic 170 determines that the predetermined maximum number vmax of verifying operations are completed, then the YES branch is selected and step 1600 is next perfumed. In decision/branch step S1600, the control logic 170 may determine whether the program pass number pp is greater than the reference number R. If the program pass number pp is greater than the reference number R then the programming may be deemed completed (END). Here, the reference number R is an integer greater than half the total verification number performed in the pass/fail verifier 160 and less than the total verification number. Alternatively the reference number R is an integer greater than 2 and less than the total verification number performed in the pass/fail verifier 160. If the program pass number pp is less than the reference number R, then the "NO" branch of decision/branch step S1600 is selected and step 1700 is next performed. In step S1700, the control logic 170 controls so that a next program loop (including applying a step-increased programming voltage) is performed on the same memory cell transistors on the same selected word line WL<i>.

The pass number pp is preferably counted up for every verifying operation in this exemplary embodiment, but the invention is not limited to this example. For example, the program pass result may be stored for every verifying operation, and counting up the program pass number pp may be performed between steps S1400 and S1600.

Figure 8:
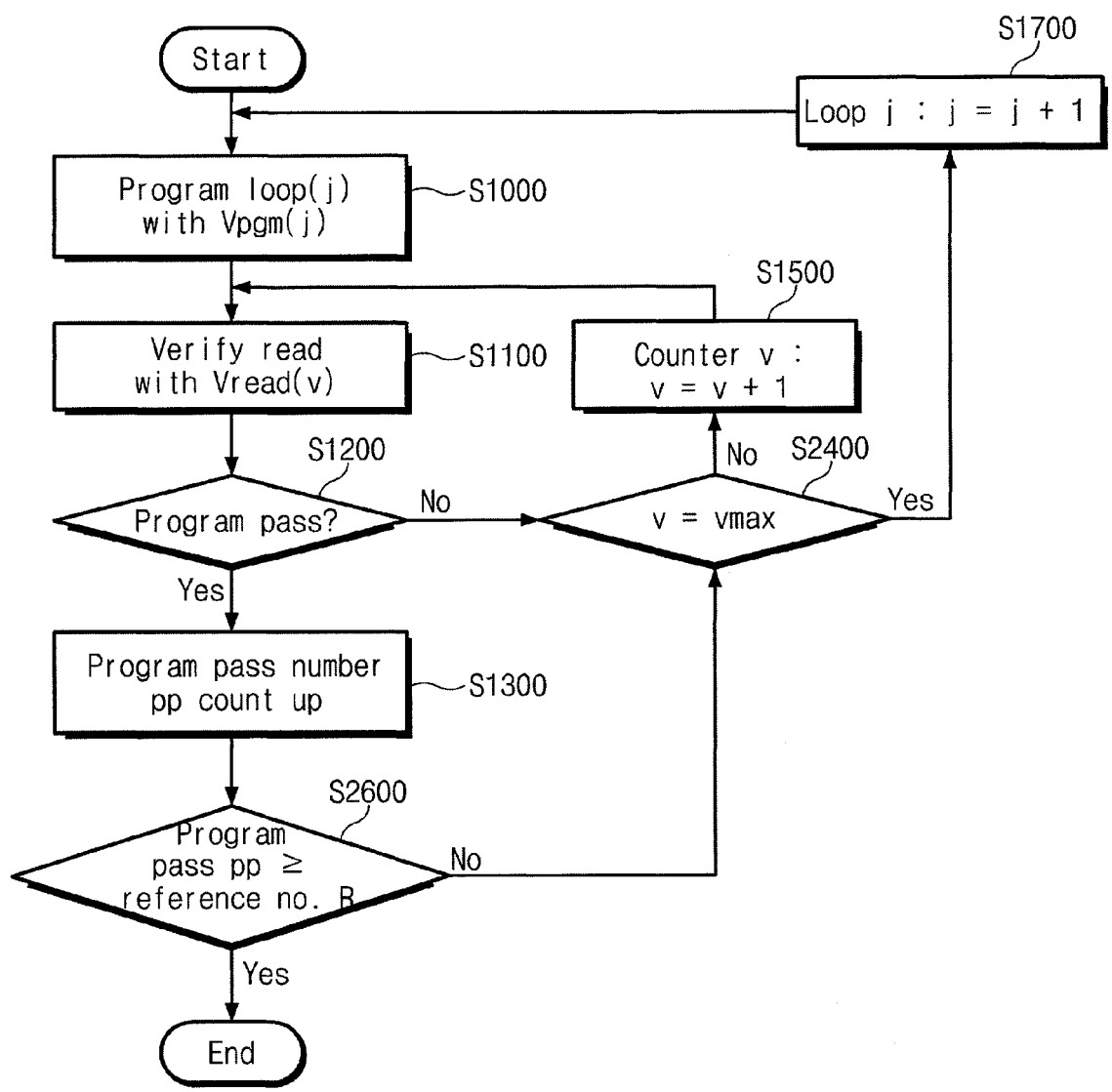
FIG. 8 is a flow chart depicting a programming method of a non-volatile memory device according to another exemplary embodiment.

FIG. 8 is a flow chart for describing a programming method of a non-volatile memory device 100 according to another exemplary embodiment. FIG. 8 illustrates the case where completion of programming is controlled each time a verifying operation is performed.

In FIG. 8, the steps S1000S1300S1000, S1100, S1200, S1300, S1400, and S1700, are identical to the corresponding steps in FIG. 7, therefore, redundant description S1000S1300 of these steps will be omitted for sake of brevity. In case of the programming method in FIG. 7, the program pass number pp is counted, and then (afterwards) it is determined whether the predetermined maximum number vmax of verifying operations have been completed. On the other hand, in case of the programming method in FIG. 8, a control logic 170 counts up the program pass number pp in step S1300, and determines whether the program pass number pp has reached the reference number R in step S2600. Here, the reference number R may be a predetermined value which is an integer greater than 2 and lower than the total verifying operation number performed in a pass/fail verifier 160. Alternatively, the reference number R may be an integer higher than half the total verifying operation number performed in the pass/fail verifier 160 and lower than the total verifying operation number.

When the program pass number pp reaches the reference number R, the control logic 170 ends the re-programming and not additional program loops are performed (loop count j is not incremented). If in step S2600 the program pass number pp does not reach the reference number R, then step S2400 is next performed. In step S2400, the control logic 170 determines whether the predetermined maximum number vmax of verifying operations have been completed. If the predetermined maximum number vmax of verifying operations have been completed, then step S1700 is next performed in step S1700, the control logic 170 proceeds to perform a next program loop. If the predetermined maximum number vmax of verifying operations have not been completed, then v counter increment step S1500 is next performed and then the control logic 170 proceeds to perform a next verifying loop. In case programming is determined to be program-failed in S1200, the process moves on to S2400 in which it is determined whether the predetermined maximum number vmax of verifying operations have been completed.

Figure 9:
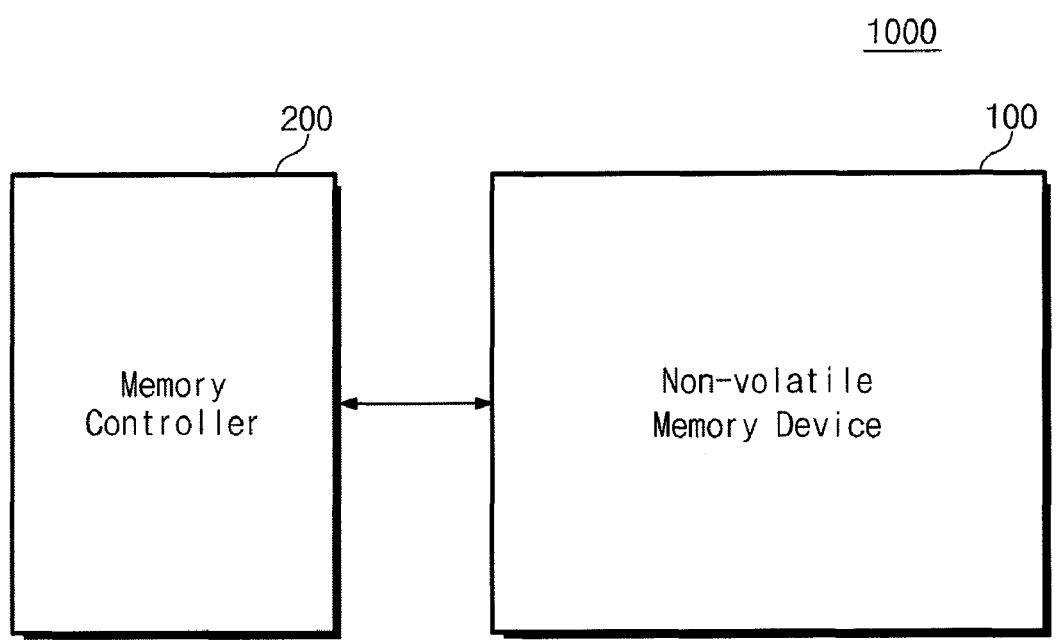
FIG. 9 is a schematic block diagram of a memory system including a non-volatile memory device of FIG. 1.

FIG. 9 is a schematic view of a memory system 1000 including a non-volatile memory device 100 of FIG. 1.

Referring to FIG. 9, the memory system 1000 a non-volatile memory device 100 according to any exemplary embodiments of the invention and a memory controller 200. The non-volatile memory device 100 is configured to perform programming and verification operations according to one of the programming methods described in FIG. 7 and FIG. 8, and may configured to be essentially the same as depicted in FIG. 1. The memory controller 200 is configured to control the non-volatile memory device 100.

The memory system 1000 illustrated in FIG. 9 may form a memory card and/or a memory card system, including a solid state disk (SSD). The memory controller 200 may be configured to communicate with an external device (e.g., host) through one of various known interface protocols including USB, MMC, PCI-E, Advanced Technology Attachment (ATA), Serial-ATA, Parallel-ATA, SCSI, ESDI, and Integrated Drive Electronics (IDE).

Figure 10:
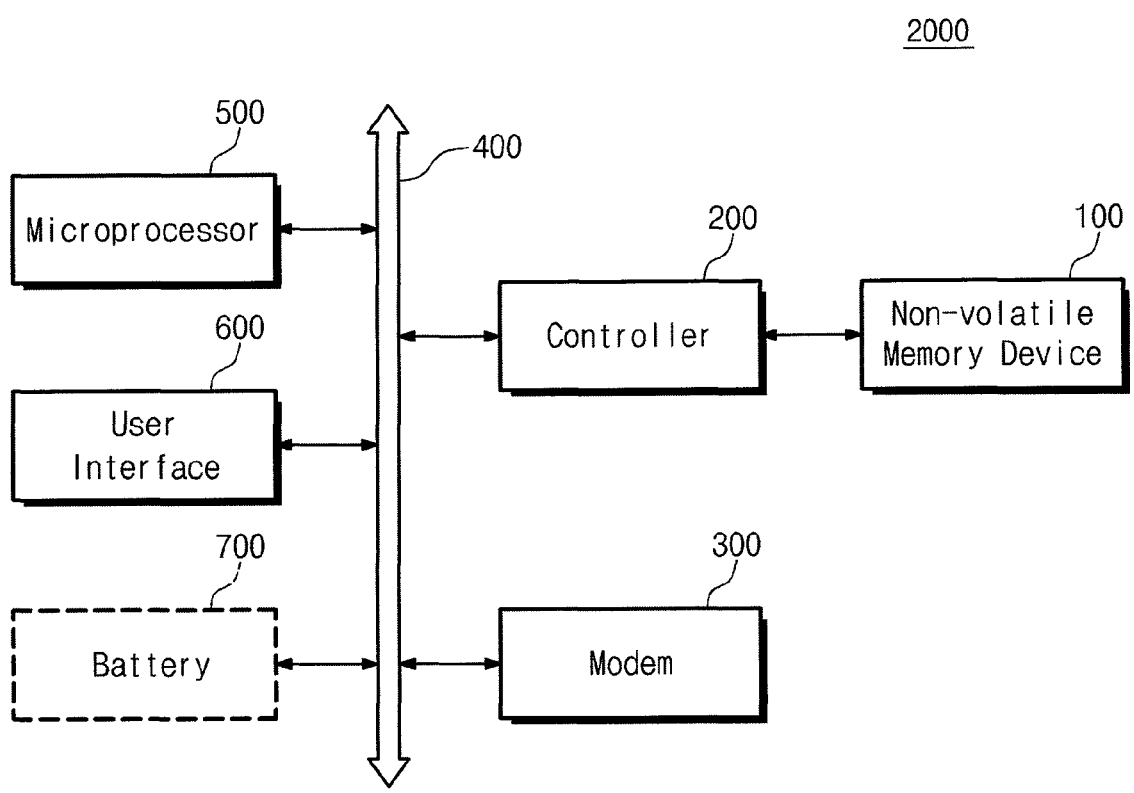
FIG. 10 is a schematic block diagram depicting the configuration of a computing system including a non-volatile memory device of FIG. 1.

FIG. 10 is a schematic block diagram depicting the configuration of a computer system including a non-volatile memory device of FIG. 1.

Referring to FIG. 10, the computer system 200 includes a non-volatile memory device 100, a memory controller 200, a modem 300 such as a baseband chipset, a microprocessor (CPU) 500, and a user interface 600. The non-volatile memory device 100 is configured to perform programming operations and verification operations according to one of the programming methods described in FIG. 7 and FIG. 8 above, and may be configured to be essentially the same as shown in FIG. 1. N-bit data (N is 1 or a larger positive number) stored by the memory controller 200 in the non-volatile memory device 100, has been processed or will be processed by the microprocessor 500.

The computing system 2000 may be a mobile device, and in that case an additional battery 700 that supplies an operation voltage for the computing system may be provided. Although not shown in drawings, an application chipset, camera image processor (CIS), and mobile DRAM may be further added to the computing system 2000. The memory controller 200 and the non-volatile memory device 100, for example, may comprise a Solid State Drive/Disk (SSD) using non-volatile memory for storing data.

The non-volatile memory device 100 and/or the memory controller 200 may be mounted using various forms of physical packages. The non-volatile memory device 100 and/or the memory controller 200 may be mounted using packages, for example, Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline(TSOP), Thin Quad Flatpack(TQFP), System In Package(SIP), Multi Chip Package (MCP), Wafer-level Fabricated Package (WFP), and Wafer-Level Processed Stack Package (WSP). In an exemplary embodiment of the invention, memory cell transistors may be realized by using one of the various memory transistor structures that include charge storage layers. The cell structure including the charge storage layer may be a charge trap flash structure that uses a charge trapping layer, a stack flash structure in which arrays are stacked in multi-layers, a flash structure without a source-drain, or a pin-type flash structure.

Although the present invention has been described in connection with the exemplary embodiments of the present invention illustrated in the accompanying drawings, it is not limited thereto. Persons skilled in the art will recognize that alternative embodiments of the present invention may be applied to other types of memory devices. The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of programming a non-volatile memory device comprising:
   programming memory cell transistors on a selected word line;
   performing a plurality v of verifying operations each verifying operation verifying whether the memory cell transistors on the selected word line are program-passed; and
   controlling whether to re-program the memory cell transistors on the selected word line based on a count number of the memory cell transistors on the selected word line that program-pass, the count number being obtained as a result of the plurality v of verifying operations,
   wherein the programming and the performing the plurality v of verifying operations are performed within one program loop.

2. The method of claim 1, wherein the controlling whether to re-program comprises not re-programming if the number of memory cell transistors on the selected word line that program-pass is higher than a reference number R, wherein R is an integer.

3. The method of claim 2, wherein the reference number R is an integer higher than half a total verifying number performed in the verifying operations and lower than the total verifying number.

4. The method of claim 2, wherein the reference number R is an integer greater than 2 and less than the total verifying number performed in the verifying operations.

5. The method of claim 2, wherein the controlling whether to re-program further comprises, if the program-pass number is lower than the reference number R, re-programming and re-performing a plurality of verifying operations.

6. The method of claim 1, wherein the controlling whether reprogram is decided after the plurality of verifying operations have been completed.

7. The method of claim 1, wherein the controlling whether re-program is decided after each time the plurality of verifying operations is performed.

8. The method of claim 7, wherein the controlling whether re-program comprises not re-programming if the program-pass number reaches the reference number R before the plurality of verifying operations have been completed.

9. The method of claim 7, wherein the controlling whether re-program comprises performing the re-programming and re-performing the plurality of verifying operations if the program-pass number does not reach the reference number R after the plurality of verifying operations have been completed.

10. A non-volatile memory device comprising:
    a memory cell transistor array having memory cell transistors arranged in rows and columns;
    a write circuit configured to program memory cell transistors on a selected word line;
    a verifier configured to a verifying operation on the memory cell transistors on the selected word line each verifying operation verifying whether the memory cell transistors on the selected word line are program-passed; and
    a control circuit configured to control whether to re-program the memory cell transistors on the selected word line based on a count number of the memory cell transistors on the selected word line that are program-passed, the count number being obtained from a result of the plurality of verifying operations,
    wherein the programming operation and the plurality of the verifying operations comprise one program loop.

11. The non-volatile memory device of claim 10, wherein the control circuit ends the programming of the memory cell transistors on the selected word line if the program-pass number is greater than a reference number R, wherein R is an integer.

12. The non-volatile memory device of claim 11, wherein the reference number R is an integer higher than half of the total verifying number performed in the verifier and lower than the total verifying number.

13. The non-volatile memory device of claim 11, wherein the reference number R is an integer higher than 2 and lower than the total verifying number performed in the verifier.

14. The non-volatile memory device of claim 11, wherein if the program-pass number is less than the reference number R, the control circuit re-performs the programming and the plurality of verifying operations.

15. The non-volatile memory device of claim 10, wherein the control circuit decides whether to end the programming of the memory cell transistors on the selected word line after the plurality of verifying operations are completed.

16. The non-volatile memory device of claim 10, wherein the control circuit decides whether to end the programming of the memory cell transistors on the selected word line after each of the plurality of verifying operations is performed.

17. The non-volatile memory device of claim 16, wherein the control circuit ends the programming of the memory cell transistors on the selected word line if the program-pass number reaches the reference number R before the plurality of verifying operations are completed.

18. The non-volatile memory device of claim 16, wherein the control part re-performs the programming and the plurality of verifying operations if the program-pass number does not reach the reference number R before the plurality of verifying operations are completed.

19. A memory system comprising:
    the non-volatile memory device of claim 10; and
    a memory controller configured to control the non-volatile memory device.

* * * * *